(12) United States Patent
Kloster et al.

(10) Patent No.: US 7,186,637 B2
(45) Date of Patent: Mar. 6, 2007

(54) METHOD OF BONDING SEMICONDUCTOR DEVICES

(75) Inventors: Grant Kloster, Lake Oswego, OR (US); Shriram Ramanathan, Hillsboro, OR (US); Chin-Chang Chen, Portland, OR (US); Paul Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 204 days.

(21) Appl. No.: 10/631,508

(22) Filed: Jul. 31, 2003

(65) Prior Publication Data

US 2005/0025942 A1    Feb. 3, 2005

(51) Int. Cl.
H10L 21/44    (2006.01)
H10L 23/52    (2006.01)
H10L 23/48    (2006.01)
H10L 23/40    (2006.01)
H10L 23/485   (2006.01)

(52) U.S. Cl. .................. 438/614; 438/613; 438/615; 257/780; 257/781; 257/E23.021

(58) Field of Classification Search ........ 438/613–615; 257/780–781, E23.021
See application file for complete search history.

(56) References Cited

U.S. PATENT DOCUMENTS

| 5,646,067 | A |  | 7/1997 | Gaul |  |
|---|---|---|---|---|---|
| 5,811,351 | A | * | 9/1998 | Kawakita et al. | 438/613 |
| 5,897,336 | A | * | 4/1999 | Brouillette et al. | 438/108 |
| 6,319,819 | B1 |  | 11/2001 | Besser et al. |  |
| 6,352,940 | B1 |  | 3/2002 | Seshan et al. |  |
| 6,365,500 | B1 | * | 4/2002 | Chang et al. | 438/614 |
| 6,410,435 | B1 |  | 6/2002 | Ryan |  |
| 6,423,613 | B1 |  | 7/2002 | Geusic |  |
| 6,455,425 | B1 |  | 9/2002 | Besser et al. |  |
| 6,515,358 | B1 |  | 2/2003 | Dass et al. |  |
| 6,537,913 | B2 |  | 3/2003 | Modak |  |
| 6,565,729 | B2 |  | 5/2003 | Chen et al. |  |
| 6,566,737 | B2 |  | 5/2003 | Bohr |  |
| 2002/0072928 | A1 |  | 4/2003 | Edelstein et al. |  |
| 2003/0072928 | A1 |  | 4/2003 | Edelstein et al. |  |

* cited by examiner

*Primary Examiner*—Luan Thai
(74) *Attorney, Agent, or Firm*—Blakely, Sokoloff, Taylor & Zafman LLP

(57) ABSTRACT

A method of bonding semiconductor devices is disclosed. The method comprises providing a first substrate having a first conductive interconnecting structure formed thereon and a second substrate having a second conductive interconnecting structure formed thereon. A first conductive passivation layer is selectively formed over exposed areas of the first conductive interconnecting structure. A second conductive passivation layer is selectively formed over exposed areas of the second conductive interconnecting structure. The first substrate and the second substrate are bonded together in such a way that the first conductive passivation layer bonds to the second conductive passivation layer to create a passivation-passivation interface.

18 Claims, 5 Drawing Sheets

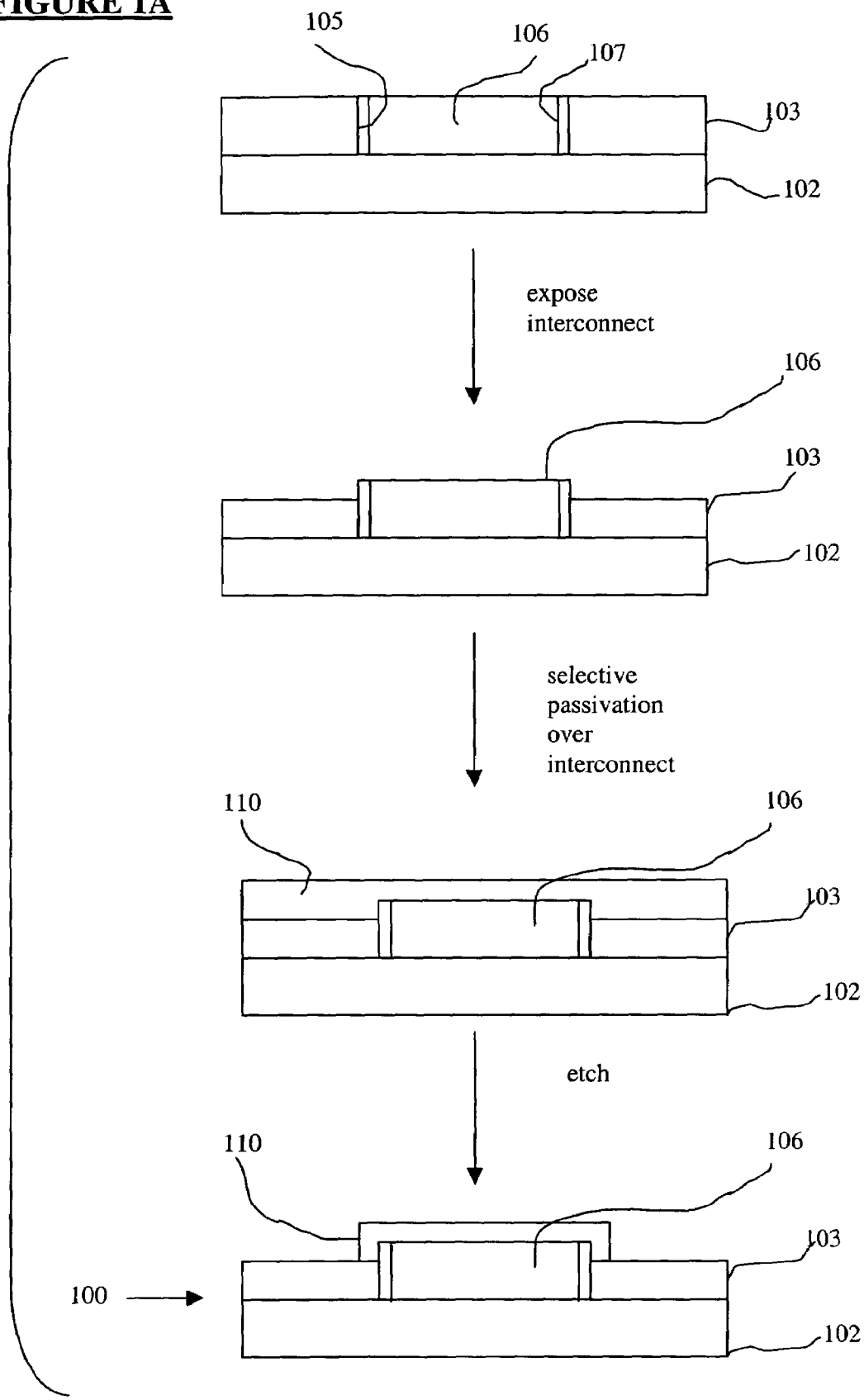

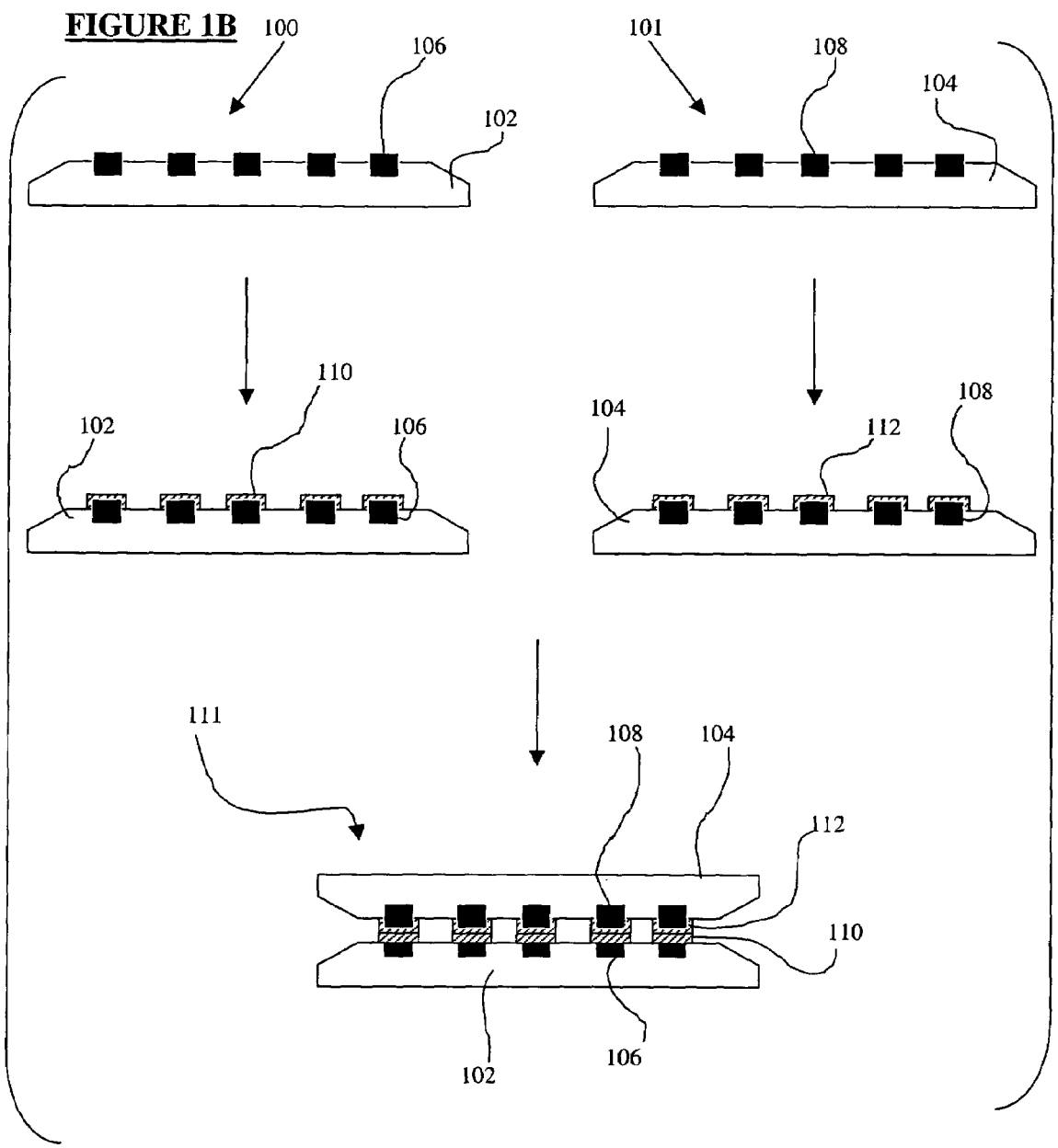

METHOD OF BONDING SEMICONDUCTOR DEVICES

BACKGROUND

1. Field

A method of bonding semiconductor devices and more particularly, a method of bonding conductive interconnecting structures formed on a first substrate to conductive interconnecting structures formed on second substrate.

2. Description of the Related Art

Increasingly complex electronic systems require increasingly denser structures of integrated circuits, passive components, and other discrete elements. Typical two-dimensional structures, where the elements are laid out on a printed circuit board or similar structure are beginning to not meet the size, weight, and performance requirements of advanced electronic systems. Hence, three-dimensional structures are being used to provide the needed levels of electronic circuit integration. These three-dimensional structures generally comprise multiple layers of devices along with multiple layers of interconnects to provide electrical connections between the devices.

One approach for providing interconnects in a multiple layer structure is to bond semiconductor devices formed on a substrate (e.g., a first substrate) to semiconductor devices from another substrate (e.g., a second substrate). Such bonding can continue for several layers expanding vertically. Bonding typically occurs between a dielectric layer formed on the first substrate to another dielectric layer formed on the second substrate. Conductive metalizations for the devices on the substrate are formed through the dielectric layer (e.g., through openings or vias created in the dielectric layer) on the substrate to interconnect to conductive metalizations for devices on the second substrate. Alternatively, bonding can occur between a conductive metalization layer formed on the first substrate and another conductive metalization layer formed on the second substrate.

One major issue with wafer bonding as mentioned above is fast diffusion of the conductive metalization layers. Another issue is that the conductive metalization layers oxidize after the bonding of the two wafers together. Oxidation and diffusion of the conductive metalization layers results in degraded line resistance, electromigration performance, line-line shorting through diffusion of the conductive metalization layers, and device reliability.

BRIEF DESCRIPTION OF THE DRAWINGS

The disclosure is illustrated by way of example and not by way of limitation in the figures of the accompanying drawings in which like references indicate similar elements. The invention may best be understood by referring to the following description and accompanying drawings that are used to illustrate embodiments of the invention. In the drawings:

FIG. 1A illustrates an exemplary embodiment of forming a conductive interconnecting structure formed on a substrate;

FIG. 1B illustrates an exemplary embodiment of bonding a conductive interconnecting structure formed on a first substrate to a conductive interconnecting structure formed on a second substrate;

DETAILED DESCRIPTION

Figure 2:
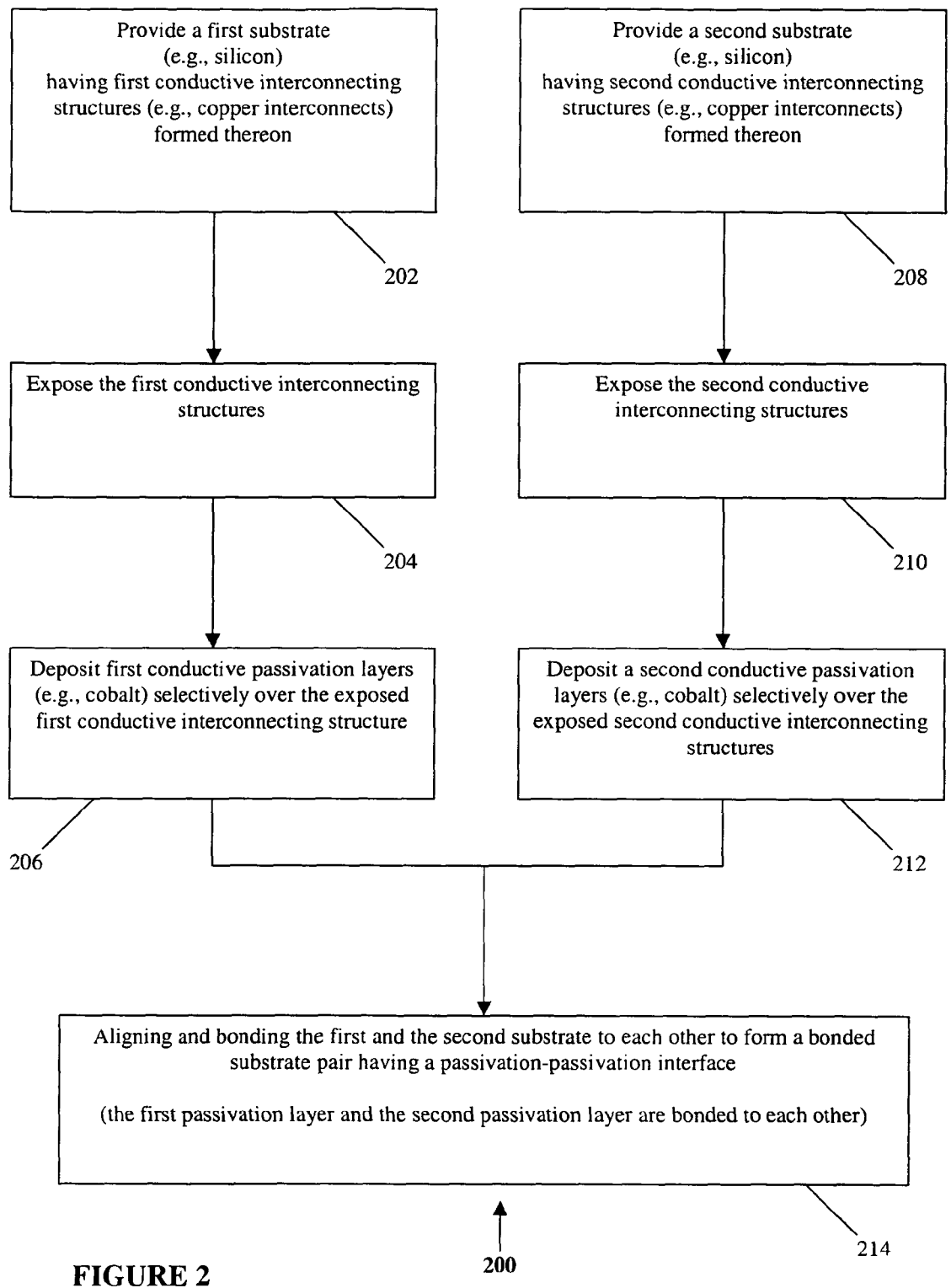
FIG. 2 illustrates another exemplary embodiment of bonding a conductive interconnecting structure formed on a first substrate to a conductive interconnecting structure formed on a second substrate.

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

The exemplary embodiments of the present invention pertain to bonding at least two substrates having devices patterned thereon to each other. The substrates are typically semiconductor substrates or wafers made of semiconductor material such as monocrystalline silicon wafers, polycrystalline silicon, silicon on insulator (SOI) substrates, or gallium arsenide. The substrates may include passive and/or active devices formed therein such as transistors, capacitors, resistors, diffused junctions, gate electrodes, local interconnects, etc. . . . In addition, the substrate includes one or more conductive interconnecting structures that are separated from each other, or from the active/passive devices by one or more dielectric layers. In one embodiment, a conductive passivation layer is formed over each of the conductive interconnecting structures. The conductive passivation layer may completely cover all exposed areas of the conductive interconnecting structures. Alternatively, subsequent processing of the conductive passivation layer may be removed and leave the top surfaces of the conductive interconnecting structures exposed.

The two substrates are bonded together by a bonding between conductive interconnecting structures from one substrate to conductive interconnecting structures from the other substrate. In one embodiment, the conductive interconnecting structures from one substrate are bonded directly to the conductive interconnecting structures from the other substrate. In another embodiment, the conductive interconnecting structures from one substrate are bonded to the conductive interconnecting structures from the other substrate through the conductive passivation layers. The conductive interconnecting structures thus interconnect the devices from one substrate to other devices from the other substrate. The conductive interconnecting structures also function to bond the two substrates together. It is to be noted that the bonding can be performed several substrates to create a multi-layer structure.

FIG. 1A illustrates an exemplary embodiment of fabricating a semiconductor device 100 in a first substrate. A substrate 102, which can be silicon, monocrystalline silicon, SOI, or gallium arsenide, is provided. The substrate 102 may include an active/passive electronic device formed therein. For example, the substrate 102 may include a transistor, capacitor, resistor, diffused junction, gate electrode, local interconnect, and etc . . . , that can be formed into the substrate 102 as is known in the art.

A dielectric layer 103 is formed over the substrate 102. The dielectric layer 103 functions to insulate one device from another. The dielectric layer 103 also functions to insulate one conductive layer from another. The dielectric layer 103 is formed over the substrate 102 using conventional methods such as chemical vapor deposition (CVD), plasma enhanced CVD, or high-density plasma CVD. The dielectric layer 103 can be made of silicon oxide (e.g., $SiO_2$), silicon nitride (e.g., $Si_3N_4$) fluorosilicate glass, or organic polymers such as polyimides, parylenes, polyarylethers, organosilicones, polynaphthalenes, polyquinolines, or copolymers thereof.

Next, a conductive interconnecting structure 106 is formed. The desired arrangement of the conductive interconnecting structure 106 is defined as a pattern of recesses such as vias 105, (e.g., openings, holes, grooves, trenches, etc . . .) formed by conventional photolithographic and etching techniques in the surface of the dielectric layer 103. The conductive interconnecting structure 106 is then deposited by a conventional method (e.g., plating technique, such as electroless or electroplating), to fill the vias 105. The conductive interconnecting structure 106 can be cobalt, tungsten, titanium, aluminum, chromium, nickel, silver, gold, copper, cobalt alloy, tungsten alloy, titanium alloy, aluminum alloy, aluminum alloy, chromium alloy, nickel alloy, silver alloy, gold alloy, copper alloy, and any combination thereof.

In one embodiment, a barrier layer 107 is deposited in the vias 105 to line the vias 105 before the conductive interconnecting structure 106 is deposited. The barrier layer 107 functions to inhibit oxidation of the conductive interconnecting structure 106, provide a good adhesion of the conductive interconnecting structure 106 to the dielectric layer 103, reduce electro migration of the conductive material (e.g., when the conductive material is copper), prevent diffusion of copper into dielectric layer, and lower the resistance of the conductive interconnecting structure 106. The barrier layer 107 can be deposited into the vias 105 using conventional methods such as PVD (e.g., sputtering, ion plating, or vacuum evaporation). The barrier layer 107 can be tantalum, titanium, tantalum nitride, titanium nitride, or other material suitable to perform the functions mentioned above.

In one embodiment, in order to ensure complete filling of the vias 105, the conductive metalization layer is deposited as a blanket layer of an excess thickness so as to overfill the vias 105 and cover the upper surface of the dielectric layer 103.

Next, the conductive interconnecting structure 106 and the dielectric layer 103 are polished to expose the conductive interconnecting structure 106. As shown in FIG. 1A, the top surface of the dielectric layer 103 and some of the conductive interconnecting structure 106 are removed. This is done to expose the top portion of the conductive interconnecting structure 106 to enable bonding to the conductive interconnecting structure 106. In one embodiment, the excess thickness conductive interconnecting structure 106 is removed by a chemical mechanical polishing (CMP) process utilizing an alumina-based slurry. The CMP process is biased so that more of the dielectric layer 103 is removed so as to leave the dielectric layer 103 recessed and the top portion of the conductive interconnecting structure 106 significantly exposed. The conductive interconnecting structure 106 and the dielectric layer 103 are thus substantially non-coplanar with each other.

Next, a conductive passivation layer 10 is deposited over the conductive interconnecting structure 106 as shown in FIG. 1A. The conductive passivation layer 110 protects the conductive interconnecting structure 106. The conductive interconnecting structure 106 is typically made of copper, copper alloy or other metals that erodes or oxidizes easily. Copper or these other easily oxidized metals can be bonded to one another easily thus making the bonding of two semiconductor devices to each other via the conductive interconnecting structure easier. However, after bonding, copper often gets oxidized easily and quickly, and can degrade line resistance. In addition, free copper surfaces are vulnerable to electro migration and ultimately can cause electro migration failure, and line-line shorting. The conductive passivation layer 110 thus must be made from a material that can protect the conductive interconnecting structure 106, prevent the conductive interconnecting structure 106 from oxidizing and diffusing into adjacent layers, act as a diffusion barrier layer for the conductive interconnecting structure 106, and prevent oxygen or moisture from diffusing into the conductive interconnecting structure 106. In one embodiment, the conductive passivation layer 110 is made from materials may be from a group consisting of cobalt, tungsten, titanium, aluminum, cobalt alloy, tungsten alloy, titanium alloy, aluminum alloy, aluminum alloy, and any combination thereof. Optimally, the conductive passivation layer 110 is made of cobalt and cobalt alloys. In addition, the passivation layer 110 must be conductive so as to allow for electrical connections between the conductive interconnecting structure 106 and another interconnecting structure.

In some embodiments, the conductive interconnecting structure 106 can be made of the same material as the conductive passivation layer 110. In these embodiments, the chosen material must be able to protect, or self-passivate itself from oxidation and diffusion. Examples of materials that can be used to form both the conductive interconnecting structure 106 and the conductive passivation layer 110 include titanium and aluminum.

The conductive passivation layer 110 is formed by a selective deposition process that selectively deposits the conductive passivation layer 110 over the exposed areas of the conductive interconnecting structure 106. In one embodiment, electroless plating is used to selectively deposit the conductive passivation layer 110 over the conductive interconnecting structure 106. Selection of materials, but not limited to, include cobalt and cobalt alloys. In this approach, the conductive interconnecting structures are first subjected to a cleaning process to remove existing oxides, followed by subsequent selective deposition of passivation layer with or without activation with a noble metal. In another embodiment, the conductive passivation layer 110 is formed by blanket deposition and a lithography and etching process is used to remove the conductive passivation layer 110 from the dielectric layer 103 and to retain the conductive passivation layer 110 on the expose surfaces of the conductive interconnecting structure 106 as shown in FIG. 1A.

The semiconductor device 100 is then ready for bonding to another device formed similarly to the device 100. In one embodiment, the device 100 is bonded to a semiconductor device 101 as shown in FIG. 1B. The device 100, which includes the substrate 102, the conductive interconnecting structures 106, and the conductive passivation layers 110, is fabricated as previously described. The device 101 includes a substrate 104, conductive interconnecting structures 108, and conductive passivation layers 112. The device 101 is fabricated similarly to the device 100 previously described. In one embodiment, the conductive interconnecting structures 106 and 108 are made of copper and the conductive passivation layers 110 and 112 are made of cobalt. As shown in FIG. 1B, each conductive passivation layers 110 and 112 covers all exposed surfaces of each of the conductive interconnecting structures 106 and 108.

The devices 100 and 101 are then bonded together through the passivation layers 110 and 112 forming a multi-layer semiconductor device 111 with a passivation-passivation contact. The bonding condition is chosen so that the passivation layers 110 and 112 can be bonded to each other. The bonding pressure is a predetermined pressure that is sufficient to bond the passivation layers 110 and 112 together. The predetermined pressure depends on the type of material chosen for the passivation layers 110 and 112. In one embodiment, cobalt is the chosen material and the predetermined pressure is less than 250 mega Pascal. The bonding temperature is a predetermined temperature that is sufficient to bond the passivation layers 110 and 112 together. The predetermined temperature depends on the type of material chosen for the passivation layers 110 and 112. In the embodiment where cobalt is the chosen material, the predetermined temperature is less than 500° C., optimally, between 200–500° C. The bonding duration is a predetermined duration that is sufficiently long to bond the passivation layers 110 and 112 together. The predetermined duration depends on the type of material chosen for the passivation layers 10 and 112 as well as the bonding temperature and the pressure. In one embodiment, the predetermined duration is between 0.5–3 hours. In one embodiment, the bonding of the devices 100 and 101 occurs at a bonding temperature between about 200–400° C., and at a pressure less than 100 mega Pascal. In this embodiment, bonding may occur for a duration of 0.5–3 hours, optimally, 2 hours. In the embodiments where the conductive passivation layers 110 and 112 are made of cobalt, the bonding of the devices 100 and 101 form a multi-layer structure 111 having a cobalt-cobalt contact.

In one embodiment, a conventional alignment system is used to align the devices 100 and 101 over each other so that the conductive passivation layers 110 and 112 are aligned over each other prior to bonding. The alignment system may include mechanical and/or photographical alignment markers. For example, alignment markers are printed, embossed, punched, or otherwise indicated on each of the substrate 102 and 104 in precise locations. The substrate 102 and 104 are adjusted so that the locations are in alignment with each other prior to bonding.

It is optimal to have the conductive passivation layers 110 and 112 be as thin as possible to allow efficient current transfer between the conductive interconnecting structures 106 and 108. The deposition process for the conductive passivation layers 110 and 112 is chosen so that each of the conductive passivation layers 110 and 112 has a thickness ranging between about 10–400 Å. In one embodiment, the conductive passivation layers 110 and 112 have a thickness of about 200 Å. In another embodiment, the conductive passivation layers 110 and 112 have a thickness less than 50 Å.

FIG. 2 illustrates an exemplary method 200 of fabricating a multi-layer semiconductor device. At box 202, a first substrate (e.g., a silicon wafer) is provided. The first substrate typically has active or passive devices such as transistors, capacitors, etc . . . , already formed thereon. In addition, the first substrate has first conductive interconnecting structures (e.g., copper metalization) formed thereon. The first conductive interconnecting structures are typically formed over the active or passive devices. At box 204, the first conductive interconnecting structures are exposed as previously described. At box 206, conductive passivation layers (e.g., cobalt layers) are selectively deposited over the exposed first conductive interconnecting structures. The first conductive passivation layers may be cleaned to ensure that a clean surface is provide prior to bonding. The first substrate is now ready for bonding to another substrate.

At box 208, a second substrate (e.g., a silicon wafer) is provided. The second substrate typically has active or passive devices such as transistors, capacitors, etc . . . , already formed thereon. In addition, the second substrate has second conductive interconnecting structures (e.g., copper metalization) formed thereon. The second conductive interconnecting structures are typically formed over the active or passive devices. At box 210, the second conductive interconnecting structures are exposed as previously described. At box 212, conductive passivation layers (e.g., cobalt layers) are selectively deposited over the exposed second conductive interconnecting structures. The second conductive passivation layers may be cleaned to ensure that a clean surface is provide prior to bonding. The second substrate is now ready for bonding to another substrate.

At box 214, the first substrate and the second substrate are bonded together. The first substrate and the second substrate are aligned over each other such that the conductive passivation layers are aligned over one another for optimal bonding. The first conductive passivation layers and the second conductive passivation layers are bonded to each other to formed a substrate pair with a passivation-passivation interface.

Figure 3:
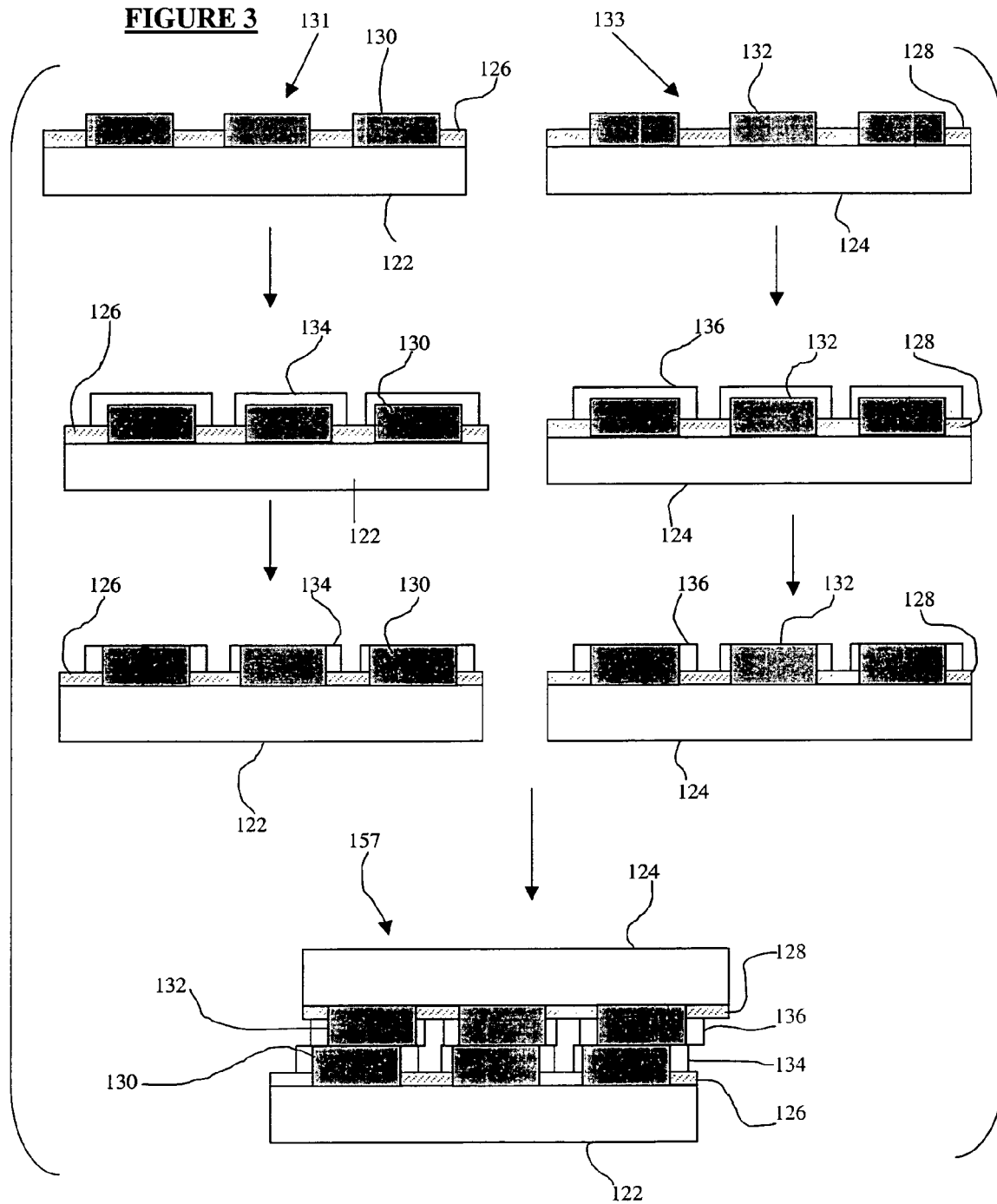
FIGS. 3–4 illustrates an alternative embodiment of bonding a conductive interconnecting structure formed on a first substrate to a conductive interconnecting structure formed on a second substrate.

FIG. 3 illustrates an exemplary embodiment of fabricating a multi-layer semiconductor device 157. A device 131 and 133 are formed. The devices 131 and 133 are then bonded together to form the multi-layer semiconductor device 157.

For the device 131, a substrate 122, which can be silicon, monocrystalline silicon, SOI, or gallium arsenide, is provided. The substrate 122 may include an active/passive electronic device formed therein. For example, the substrate 122 may include a transistor, capacitor, resistor, diffused junction, gate electrode, local interconnect, and etc . . . , that can be formed into the substrate 122 as is known in the art.

A dielectric layer 126 is formed over the substrate 122. The dielectric layer 126 functions to insulate one device from another. The dielectric layer 126 also functions to insulate one conductive layer from another. The dielectric layer 126 is formed over the substrate 122 using conventional methods such as chemical vapor deposition (CVD), plasma enhanced CVD, or high-density plasma CVD. The dielectric layer 126 can be made of silicon oxide (e.g., $SiO_2$), silicon nitride (e.g., $Si_3N_4$) fluorosilicate glass, or organic polymers such as polyimides, parylenes, polyarylethers, organosilicones, polynaphthalenes, polyquinolines, or copolymers thereof.

Next, conductive interconnecting structures 130 are formed. The desired arrangement of the conductive interconnecting structures 130 is defined as a pattern of recesses such as vias (e.g., openings, holes, grooves, trenches, etc . . . ) formed by conventional photolithographic and etching techniques in the surface of the dielectric layer 126. The conductive interconnecting structures 130 are then deposited by a conventional method (e.g., plating technique, such as electroless or electroplating), to fill the vias. The conductive interconnecting structures 130 can be cobalt, tungsten, titanium, aluminum, chromium, nickel, silver, gold, copper, cobalt alloy, tungsten alloy, titanium alloy, aluminum alloy, aluminum alloy, chromium alloy, nickel alloy, silver alloy, gold alloy, copper alloy, and any combination thereof.

In one embodiment, a barrier layer (not shown) is deposited in the vias to line the vias before the conductive interconnecting structures 130 are deposited. The barrier layer functions to inhibit oxidation of the conductive interconnecting structures 130, provide a good adhesion of the conductive interconnecting structures 130 to the dielectric layer 126, reduce electro migration of the conductive material (e.g., when the conductive material is copper), and lower the resistance of the conductive interconnecting structures 130. The barrier layer can be deposited into the vias using conventional methods such as PVD (e.g., sputtering, ion plating, or vacuum evaporation). The barrier layer can be tantalum, titanium, tantalum nitride, titanium nitride, or other material suitable to perform the functions mentioned above.

Next, the conductive interconnecting structures 130 and the dielectric layer 126 are polished to expose and electrically isolate the conductive interconnecting structures 130. This is done to expose the top portion of the conductive interconnecting structures 130 to enable bonding to the conductive interconnecting structures 130. In one embodiment, a CMP process is used to polish the dielectric layer 126 and the conductive interconnecting structures 130 and the CMP process is biased so that more of the dielectric layer 126 is removed relative to the conductive interconnecting structures so as to leave the dielectric layer 126 recessed and the top portion of the conductive interconnecting structures 130 significantly exposed. The conductive interconnecting structures 130 and the dielectric layer 126 are thus substantially non-coplanar with each other. Etch techniques could alternatively be used to recess the dielectric layer 126 from the interconnecting structures 130.

Next, conductive passivation layers 134 are deposited over the conductive interconnecting structures 130 as shown in FIG. 3. The conductive passivation layers 134 protect the conductive interconnecting structures 130. The conductive passivation layer 134 thus must be made from a material that can protect the conductive interconnecting structures 130, prevent the conductive interconnecting structures 130 from oxidizing and diffusing into adjacent layers, act as a diffusion barrier layer for the conductive interconnecting structures 130, and prevent oxygen or moisture from diffusing into the conductive interconnecting structures 130. In one embodiment, the conductive passivation layers 134 are made from a material selected from a group consisting of cobalt, tungsten, titanium, aluminum, cobalt alloy, tungsten alloy, titanium alloy, aluminum alloy, aluminum alloy, and any combination thereof. Optimally, the conductive passivation layers 134 are made of cobalt and cobalt alloy. In addition, the conductive passivation layers 134 are conductive so as to allow for electrical connections between the conductive interconnecting structures 130 and other interconnecting structures.

The conductive passivation layers 134 are formed by a selective deposition process that selectively deposits the conductive passivation layers 134 over the exposed areas of the conductive interconnecting structures 130. In one embodiment, electroless plating is used to selectively deposit the conductive passivation layers 134 over the conductive interconnecting structures 130. Selection of materials, but not limited to, include cobalt and cobalt alloys. In this approach, the conductive interconnecting structures are first subjected to a cleaning process to remove existing oxides, followed by subsequent selective deposition of passivation layer with or without activation with a noble metal. In another embodiment, the conductive passivation layers 134 are formed by blanket deposition and a lithography and etching process is used to remove the conductive passivation layers 134 from the dielectric layer 126 and to retain the conductive passivation layers 134 on the exposed surfaces of the conductive interconnecting structures 130 as shown in FIG. 3. In one embodiment, the conductive passivation layers 134 have a thickness of about 200 Å. In other embodiments, the conductive passivation layers 134 may have a thickness ranging approximately from 100 Å to 40,000 Å.

Next, portions of the conductive passivation layers 134 are removed to expose the top surfaces of the conductive interconnecting structures 130. In one embodiment, a conventional CMP process is used to remove the top portions of the conductive passivation layers 134 so as to expose the top surfaces of the conductive interconnecting structures 130 as shown in FIG. 3. In another embodiment, a conventional anisotropic etching process is used to remove the top portions of the conductive passivation layers 134 so as to expose the top surfaces of the conductive interconnecting structures 130 as shown in FIG. 3.

The device 133 is fabricated similarly to the device 131 previously described. The device 133 includes a substrate 124, conductive interconnecting structures 132 formed in and extended out of a dielectric layer 128, and conductive passivation layers 136 selectively formed over the conductive interconnecting structures 132. Portions of the conductive passivation layers 136 are also remove to expose the top surfaces of the conductive interconnecting structures 132 of the device 133 similarly to the device 131.

In one embodiment, the conductive interconnecting structures 130 and 132 are made of copper and the conductive passivation layers 134 and 136 are made of cobalt. As shown in FIG. 3, each conductive passivation layers 134 and 136 covers only the exposed side surfaces of each of the conductive interconnecting structures 130 and 132. The top surfaces of each of the conductive interconnecting structures 130 and 132 are exposed.

The devices 131 and 133 are then bonded together through the conductive interconnecting structures 130 and 132 to form the multi-layer semiconductor device 157 with an interconnecting-interconnecting interface. The bonding condition is chosen so that the top surfaces of the conductive interconnecting structures 130 and 132 can be bonded to each other. The bonding pressure is a predetermined pressure that is sufficient to bond the top surfaces of the conductive interconnecting structures 130 and 132 together. The predetermined pressure depends on the type of material chosen for the conductive interconnecting structures 130 and 132. In one embodiment, copper is the chosen material and the predetermined pressure is about 1 mega Pascal or less than 1 mega Pascal. The bonding temperature is a predetermined temperature that is sufficient to bond the top surfaces of the conductive interconnecting structures 130 and 132 together. The predetermined temperature depends on the type of material chosen for the conductive interconnecting structures 130 and 132. In the embodiment where copper is the chosen material, the predetermined temperature is less than 500° C., optimally, between 200–500° C. The bonding duration is a predetermined duration that is sufficiently long to bond the top surfaces of the conductive interconnecting structures 130 and 132 together. The predetermined duration depends on the type of material chosen for the conductive interconnecting structures 130 and 132 as well as the bonding temperature and the pressure. In one embodiment, the predetermined duration is between 0.5–3 hours. In the embodiments where the conductive interconnecting structures 130 and 132 are made of copper, the bonding of the devices 131 and 133 form a multi-layer structure 157 having a copper-copper interface.

In one embodiment, a conventional alignment system is used to align the devices 131 and 133 over each other so that the conductive interconnecting structures 130 and 132 are aligned over each other prior to bonding. The alignment system may include mechanical and/or photographical alignment markers. For example, alignment markers are printed, embossed, punched, or otherwise indicated on each of the substrate 122 and 124 in precise locations. The substrate 122 and 124 are adjusted so that the locations are in alignment with each other prior to bonding.

The bonding of the devices 131 and 133 to each other can tolerate some slight misalignment due to the presence of the conductive passivation layers 134 and 136 on the sides of the conductive interconnecting structures 130 and 132. This prevents conductive interconnect material surfaces from being exposed and greatly improves the reliability of the contacts of the interconnections for the multi-layer semiconductor devices 157.

Figure 4:
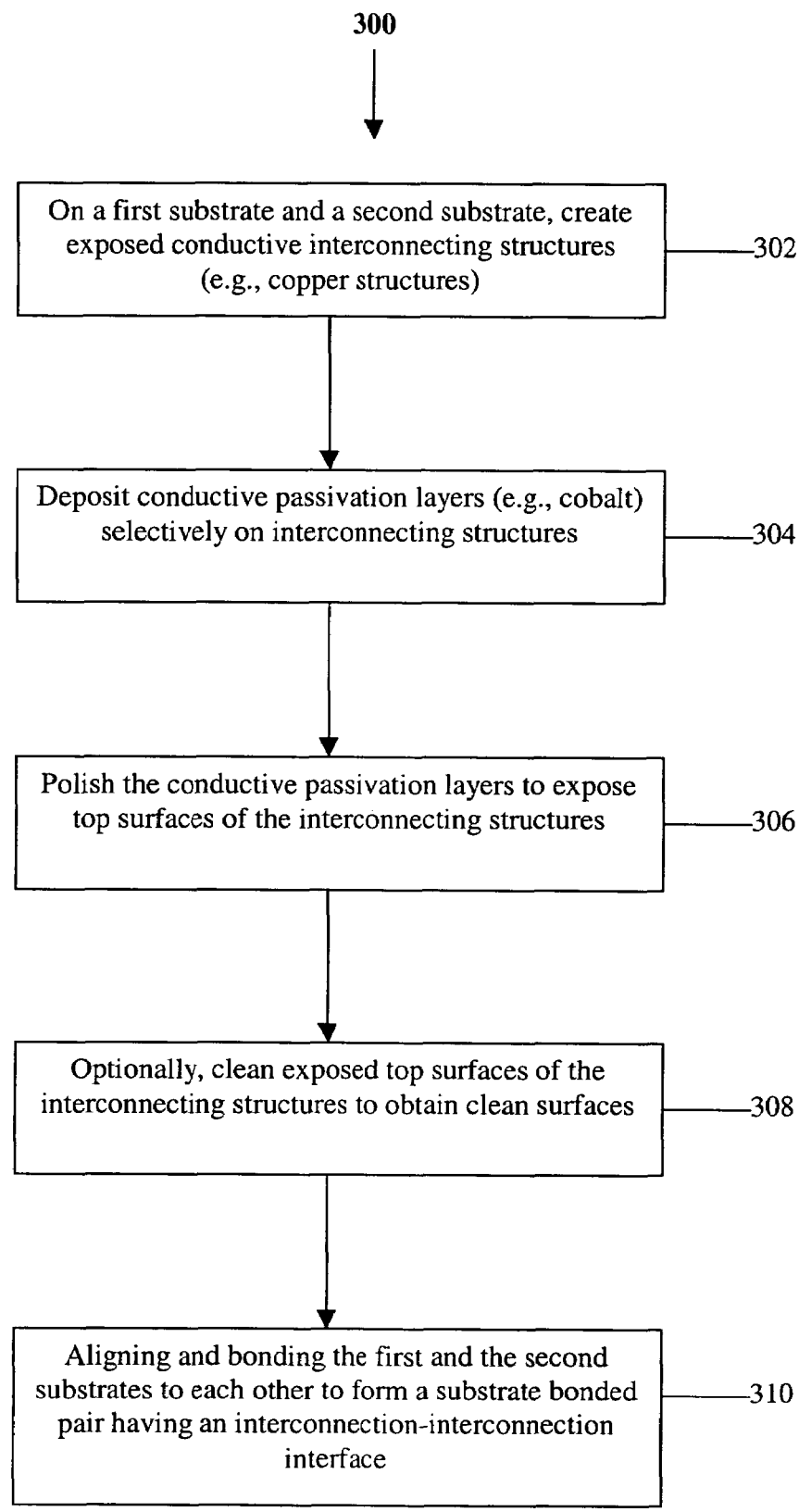

FIG. 4 illustrates an exemplary method 300 of fabricating a multi-layer semiconductor device. At box 302, a first substrate and a second substrate (e.g., a silicon wafer) are provided. Each substrate typically has active or passive devices such as transistors, capacitors, etc . . . , already formed thereon. In addition, each substrate has conductive interconnecting structures (e.g., copper metalization) formed thereon. The conductive interconnecting structures are typically formed over the active or passive devices. The conductive interconnecting structures are formed so that they are exposed.

At box 304, conductive passivation layers (e.g., cobalt layers) are selectively deposited over each of the exposed conductive interconnecting structures on the first substrate and the second substrate. At box 306, the conductive passivation layers are polished to expose the top surfaces of each of the conductive interconnecting structures. At box 308, the top surfaces of the conductive interconnecting structures and optionally, the conductive passivation layers are cleaned to ensure that clean surfaces are provided prior to bonding.

At box 310, the first substrate and the second substrate are aligned and then bonded together to form a bonded pair. The first substrate and the second substrate are aligned over each other such that the conductive interconnecting structures are aligned over one another for optimal bonding. The conductive interconnecting structures on the first substrate and the second substrate need not be in exact alignment. A minor misalignment does not affect the contact of the conductive interconnecting structures or exposed un-passivated conductive interconnect material. The bonded pair has an interconnection-interconnection interface after the bonding.

Forming multi-layer devices in accordance to the embodiments of the present invention provide several advantages. Forming multi-layer devices allows for devices to be expanded vertically. Devices connected in the vertical paths are much closer to one another since the critical paths are shorter (e.g., a few microns) as opposed to devices connected in the conventional horizontal paths that are typically millimeters apart. This in turn reduces the distance for signal travel from one device to the next thus, enhancing device performance.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. A method of making an electronic assembly comprising:

providing a first substrate having a first conductive interconnecting structure formed thereon;

providing a second substrate having a second conductive interconnecting structure formed thereon;

selectively forming a first conductive passivation layer over exposed areas of said first conductive interconnecting structure, said first conductive passivation layer protecting said first conductive interconnecting structure;

selectively forming a second conductive passivation layer over exposed areas of said second conductive interconnecting structure, said second conductive passivation layer protecting said first conductive interconnecting structure; and bonding said first substrate and said second substrate together, said first conductive passivation layer bonding to said second conductive passivation layer to create a passivation-passivation interface; and wherein said first conductive interconnecting structure is deposited as a blanket layer to overfill a first via formed in a first dielectric layer, the first conductive interconnecting structure and first dielectric layer are polished to expose the first conductive interconnecting structure and wherein said second conductive interconnecting structure is deposited as a blanket layer to overfill a second via formed in a second dielectric layer, the second conductive interconnecting structure and second dielectric layer are polished to expose the second conductive interconnecting structure.

2. The method as in claim 1 wherein said first conductive passivation layer and said second conductive passivation layer perform at least one of acting as diffusion barriers for said first and second conductive interconnecting structures, acting as oxidation barriers for said first and second conductive interconnecting structures, inhibiting oxidation of said first and second conductive interconnecting structures, acting as barriers to oxygen for said first and second conductive interconnecting structures, and protecting said first and second conductive interconnecting structures.

3. The method as in claim 1, wherein said first dielectric layer formed on said first substrate to isolate said first conductive interconnecting structure and said second dielectric layer formed on said second substrate to isolate said second conductive interconnecting structure.

4. The method as in claim 3 wherein said first and second dielectric layers are recessed relative to said first and second conductive interconnecting structures to expose said first and second conductive interconnecting structures.

5. The method as in claim 1 wherein each of said first and second conductive passivation layers is made from a material selected from a group consisting of cobalt, tungsten, titanium, aluminum, cobalt alloy, tungsten alloy, titanium alloy, aluminum alloy, aluminum alloy, and any combination thereof.

6. The method as in claim 1 wherein each of said first and second conductive interconnecting structures is made from a material selected from a group consisting of cobalt, tungsten, titanium, aluminum, chromium, nickel, silver, gold, copper, cobalt alloy, tungsten alloy, titanium alloy, aluminum alloy, aluminum alloy, chromium alloy, nickel alloy, silver alloy, gold alloy, copper alloy, and any combination thereof.

7. The method as in claim 1 wherein said bonding said first substrate and said second substrate together occurs at a predetermined pressure, temperature, and duration that are sufficient to allow bonding of said first conductive passivation layer to said second conductive passivation layer.

8. The method as in claim 7 wherein said predetermined pressure is less than 250 mega Pascal, said temperature is approximately between 200° and 500° C., and said duration is greater than 30 minutes.

9. The method as in claim 1 wherein each of said first and second conductive passivation layers has a thickness between about 20 Å and about 400 Å.

10. A method of making an electronic assembly comprising:

provide a first substrate having a first conductive interconnecting structure formed thereon;

providing a second substrate having a second conductive interconnecting structure formed thereon;

selectively forming a first conductive passivation layer over exposed areas of said first conductive interconnecting structure;

selectively forming a second conductive passivation layer over exposed areas of said second conductive interconnecting structure; and bonding said first substrate and said second substrate together, said first conductive passivation layer bonding to said second conductive passivation layer to create a passivation-passivation interface; and wherein said first conductive interconnecting structure is formed in a first via that is formed in a first dielectric layer, wherein said first via is lined with a barrier layer and wherein said second conductive interconnecting structure is formed in a second via that is formed in a second dielectric layer, wherein said second via is lined with a barrier layer.

11. The method as in claim 10 wherein said first conductive passivation layer and said second conductive passivation layer perform at least one of acting as diffusion barriers for said first and second conductive interconnecting structures, acting as oxidation barriers for said first and second conductive interconnecting structures, inhibiting oxidation of said first and second conductive interconnecting structures, acting as barriers to oxygen for said first and second conductive interconnecting structures, and protecting said first and second conductive interconnecting structures.

12. The method as in claim 10, wherein said first dielectric layer formed on said first substrate to isolate said first conductive interconnecting structure and said second dielectric layer formed on said second substrate to isolate said second conductive interconnecting structure.

13. The method as in claim 12 wherein said first and second dielectric layers are recessed relative to said first and second conductive interconnecting structures to expose said first and second conductive interconnecting structures.

14. The method as in claim 10 wherein each of said first and second conductive passivation layers is made from a material selected from a group consisting of cobalt, tungsten, titanium, aluminum, cobalt alloy, tungsten alloy, titanium alloy, aluminum alloy, aluminum alloy, and any combination thereof.

15. The method as in claim 10 wherein each of said first and second conductive interconnecting structures is made from a material selected from a group consisting of cobalt, tungsten, titanium, aluminum, chromium, nickel, silver, gold, copper, cobalt alloy, tungsten alloy, titanium alloy, aluminum alloy, aluminum alloy, chromium alloy, nickel alloy, silver alloy, gold alloy, copper alloy, and any combination thereof.

16. The method as in claim 10 wherein said bonding said first substrate and said second substrate together occurs at a predetermined pressure, temperature, and duration that are sufficient to allow bonding of said first conductive passivation layer to said second conductive passivation layer.

17. The method as in claim 15 wherein said predetermined pressure is less than 250 mega Pascal, said temperature is approximately between 200° C. and 500° C., and said duration is greater than 30 minutes.

18. The method as in claim 10 wherein each of said first and second conductive passivation layers has a thickness between about 20 Å and about 400 Å.

\* \* \* \* \*

UNITED STATES PATENT AND TRADEMARK OFFICE
CERTIFICATE OF CORRECTION

PATENT NO. : 7,186,637 B2  
APPLICATION NO. : 10/631508  
DATED : March 6, 2007  
INVENTOR(S) : Kloster et al.

Page 1 of 1

It is certified that error appears in the above-identified patent and that said Letters Patent is hereby corrected as shown below:

In column 3, at line 60, delete "10" and insert --110--.

In column 5, at line 22, delete "10" and insert --110--.

In column 11, at line 8, after "200°" insert --C--.

In column 12, at line 33, delete "15" and insert --16--.

Signed and Sealed this

Fifteenth Day of April, 2008

JON W. DUDAS  
*Director of the United States Patent and Trademark Office*